United States Patent [19]

Jones

[11] Patent Number: 5,072,264

[45] Date of Patent: Dec. 10, 1991

[54] DIAMOND TRANSISTOR AND METHOD OF MANUFACTURE THEREOF

[76] Inventor: Barbara L. Jones, 80 Chisbury Pl., Forest Park, Bracknell, RG12 3TX, England

[21] Appl. No.: 356,776

[22] Filed: May 24, 1989

[30] Foreign Application Priority Data

May 24, 1988 [GB] United Kingdom ............... 8812216

[51] Int. Cl.$^5$ ............................................ H01L 29/80
[52] U.S. Cl. ..................................... 357/22; 357/16; 357/23.1; 357/59
[58] Field of Search ................. 357/22 I, 22 P, 23.1, 357/22 A, 59 K, 2, 16, 4

[56] References Cited

U.S. PATENT DOCUMENTS 4,072,545 2/1978 De La Moneda ............... 357/59 K
4,893,155 1/1990 Ohata ............................ 357/22 A

FOREIGN PATENT DOCUMENTS 58-141572 8/1983 Japan .
59-208821 11/1984 Japan .
60-246627 12/1985 Japan .
61-207078 9/1986 Japan ............................ 357/22 A

OTHER PUBLICATIONS

Fischer, "Reducing FET Channel Cross Section," *IBM Technical Disclosure Bulletin*, Jun. 1971; vol. 14 No. 1, p. 191.

Primary Examiner—Andrew J. James
Assistant Examiner—Courtney A. Bowers
Attorney, Agent, or Firm—Scully, Scott, Murphy & Presser

[57] ABSTRACT

The invention provides a process for manufacturing a field-effect transistor on a p-type diamond substrate. The process includes depositing a layer of p' doped amorphous silicon or germanium on the surface of the substrate and depositing a layer of a first metal over the p+ layer. Portions of the layer of the first metal and the p+ layer are selectively removed to define source and drain regions of the transistor. A gate region is defined by an exposed portion of the substrate between the source and drain regions. A layer of a wide-bandgap insulating material is deposited over the source, gate and drain regions and then selectively removed to allow metallic contacts to be applied to the source, gate and drain regions.

7 Claims, 2 Drawing Sheets

DIAMOND TRANSISTOR AND METHOD OF MANUFACTURE THEREOF

BACKGROUND OF THE INVENTION

This invention relates to a field effect transistor formed from diamond material.

Field effect transistors (FETs) have been manufactured which comprise a generally conventional FET structure formed on a substrate of diamond, instead of a silicon substrate. The physical properties of diamond result in it having superior characteristics to silicon (Si), gallium arsenide (GaAs) or other known semi-conductive materials in this application. In particular, diamond FETs can be expected to have a lower resistance, and a higher gain and maximum frequency than transistors employing conventional materials.

SUMMARY OF THE INVENTION

According to the invention a field effect transistor comprises a p-type diamond substrate including spaced apart source and drain regions of p+ material with respective ohmic or quasi-ohmic source and drain contacts applied thereto at the surface of the substrate, and a gate electrode on or adjacent to the surface of the substrate between the source and drain regions.

The gate electrode may be separated from the surface of the substrate by an insulating layer of a wide-bandgap material, to provide a MISFET configuration.

Alternatively, the gate electrode may be applied directly to the surface of the substrate to provide a MESFET configuration.

The source and drain contacts applied to the source and drain regions may be quasi-ohmic contacts formed by the deposition of p+ doped amorphous silicon or germanium on the substrate above the source and drain regions, with a metal layer being deposited on the p+ doped silicon or germanium.

The metal layer may comprise aluminium, molybdenum, molybdenum/tantalum alloy, chrome, titanium, nichrome, titanium/tungsten alloy, palladium, platinum, or an aluminium/silicon alloy.

Further according to the invention a process for manufacturing a field-effect transistor includes the steps of:
providing a p-type diamond substrate;
depositing a layer of p+ doped amorphous silicon or germanium on the surface of the substrate;
depositing a layer of a first metal over the p+ layer;
selectively removing portions of the layer of the first metal and the p+ layer to define spaced apart source and drain regions of the transistor, with a gate region being defined by an exposed portion of the substrate between the source and drain regions;
depositing a layer of a wide-bandgap insulating material over the source, gate and drain regions;
selectively removing portions of the layer of insulating material; and
providing metallic contacts for the source, gate and drain regions.

In a first version of the process, a layer of a second metal, different from the first metal, is deposited over the layer of insulating material and then selectively removed from the source and drain regions, so that a MISFET structure is obtained having source and drain contacts of the first metal and a gate contact of the second metal.

In a second version of the process, a portion of the layer of insulating material is removed above the gate region to expose the substrate, a layer of a second metal having a low work function is deposited over the source, gate and drain regions, and the layer of the second metal is then selectively removed from the source and drain regions, so that a MESFET structure is obtained having source and drain contacts of the first metal and a gate contact of the second metal.

The second metal may be, in the latter case, aluminium, gold or titanium, for example.

In both versions of the process, the layer of p+ doped amorphous silicon or germanium and the layers of the first and second metals are preferably deposited by chemical vapour deposition (CVD) or physical vapour deposition (PVD).

The selective removal of portions of the various layers is preferably done by a photolithographic masking and etching process.

The wide-bandgap insulating material preferably comprises an oxide, nitride, oxynitride or carbide, and is preferably deposited by a CVD or PVD process.

DESCRIPTION OF EMBODIMENTS OF THE INVENTION

Figure 1A:
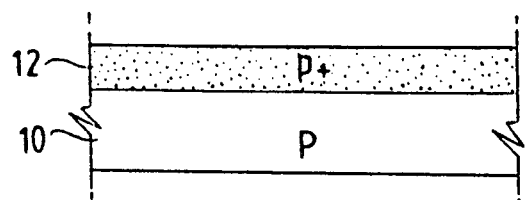
FIGS. 1a to 1f illustrate the manufacture of a MISFET by a first version of the process of the invention.

Referring to FIG. 1a, a p-type diamond substrate 10 is shown schematically. A layer 12 of p+ doped amorphous silicon or germanium is applied to the upper surface of the substrate 10 by means of a chemical vapour deposition (CVD) process, or by means of a physical vapour deposition (PVD) process.

Figure 1B:
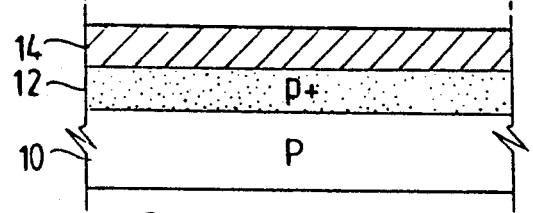

In FIG. 1b, a layer 14 of a first metal is deposited on top of the p+ layer 12, again by means of a CVD or PVD process. Examples of metals which are suitable are aluminium, molybdenum, molybdenum/tantalum alloy, chrome, titanium, nichrome, titanium/tungsten alloy, palladium, platinum, or an aluminium/silicon alloy.

Figure 1C:
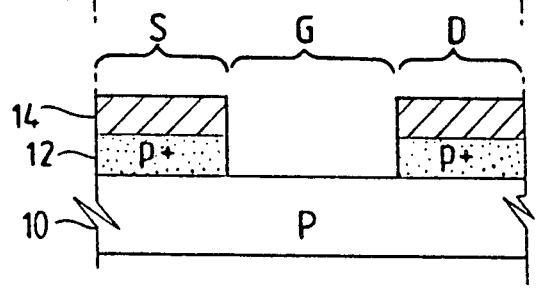

In FIG. 1c, a portion of the layers 14 and 12 has been removed selectively by a photolithographic masking and a chemical etching process, exposing the substrate 10 in a region which defines the gate of the transistor. Regions on either side of the gate (G) area define the source (S) and drain (D) of the transistor.

Figure 1D:
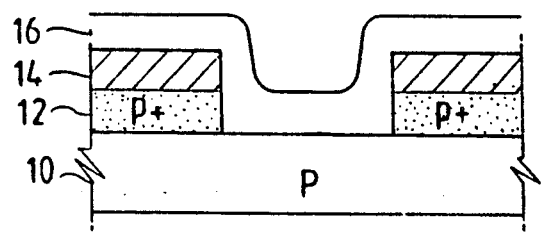

Turning to FIG. 1d, a layer 16 of a wide-bandgap insulating material is applied over the structure of FIG. 1c, again by means of a CVD or PVD process, covering the source, gate and drain regions. The insulating material is an oxide, nitride, oxynitride, or a carbide.

Figure 1E:
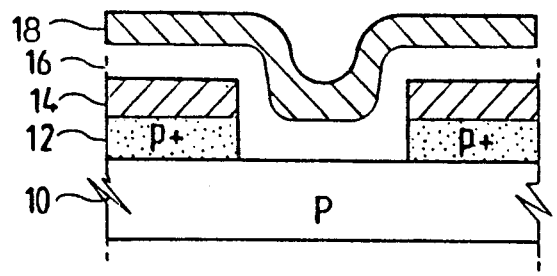

The next step in the process is illustrated by FIG. 1e, which shows a further metallic layer 18, of a second metal which is different from the metal of the layer 14, deposited onto the layer 16 of insulating material. Again, a CVD or PVD process is used. The second metal, although different from the first metal of the layer 14, is selected from the group of metals listed above.

Figure 1F:
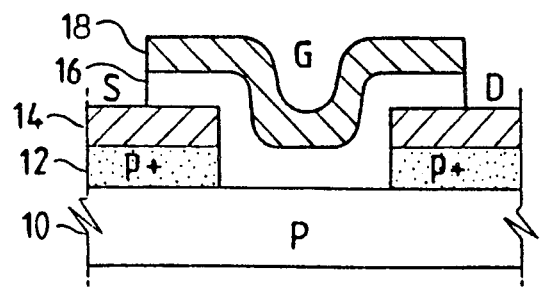

Finally, as shown in FIG. 1f, portions of the layers 18 and 16 are selectively removed by photolithographic masking and chemical etching, to expose the metallic layer 14 above the source and that the transistor is provided with metallic contacts of the first metal for the source and drain regions, and a contact of the second metal for the gate region. The transistor has a MISFET structure, with the insulating layer 16 lying between the metal gate contact and the p-type semiconductor substrate of the transistor.

Although the illustrated transistor has no p-n junctions, a transistor switching action is, nevertheless, obtained. If a positive voltage is applied to the gate contact, a corresponding negative charge is induced in the insulating layer adjacent the gate contact. This is balanced by a positive charge in the insulating layer adjacent the surface of the substrate, which again induces a negative charge in the substrate adjacent its surface. This effectively forms an n-type channel in the substrate between the source and drain regions.

Referring now to FIGS. 2a to 2d, a process for manufacturing a second version of the transistor will be described. The second version of the process is similar to that described above, up to the point were the layer 16 of insulating material is applied to the structure illustrated in FIG. 1d. The structure of FIG. 2a therefore corresponds to that of FIG. 1d.

Figure 2A:
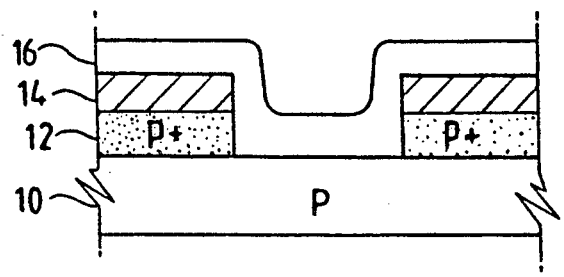
FIGS. 2a to 2d illustrate the manufacture of a MESFET transistor according to a second version of the process.
Figure 2B:
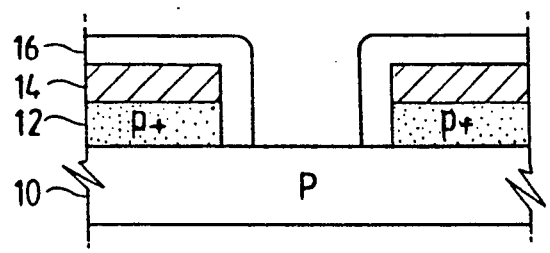
Figure 2C:
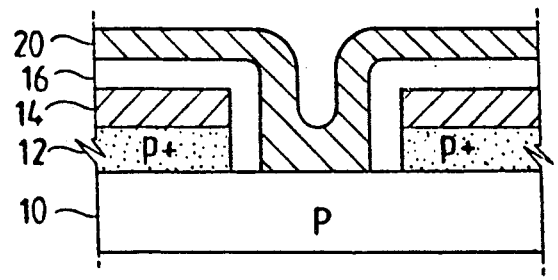

Referring now to FIG. 2b, the insulating layer 16 is selectively etched right down to the surface of the substrate 10, to define a gate (G) region. Then, as shown in FIG. 2c, a layer 20 of a second metal, which differs from the metal of the layer 14, is deposited over the structure by a CVD or PVD process. The metallic layer 20 is thus in contact with the surface of the substrate 10 in the gate region.

Figure 2D:
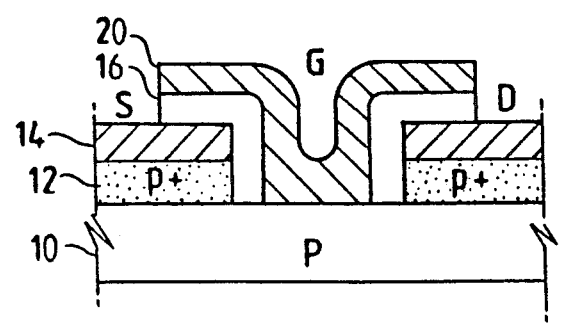

Finally, as shown in FIG. 2d, the layers 20 and 16 are selectively removed by photolithographic masking and chemical etching, to expose the metal layer 14 above the source and drain regions of the transistor. A transistor is thus obtained which has source and drain contacts of the first metal and a gate contact of the second metal. In this case, however, the transistor has a MESFET configuration, with the metallic gate contact being directly in contact with the substrate 10 in the gate region of the transistor. The layer 16 of insulating material serves to isolate the gate contact from the source and drain contacts.

I claim:

1. A field effect transistor characterized in that it comprises a p-type diamond substrate including spaced apart source and drain regions at the surface of the substrate defined by zones of non-diamond p+ material with respective ohmic or quasi-ohmic source and drain contacts applied thereto, and a gate electrode over the surface of the substrate between the source and drain regions.

2. A field effect transistor according to claim 1 characterised in that the gate electrode is separated from the surface of the substrate by an insulating layer of a wide-bandgap material, to provide a MISFET configuration.

3. A field effect transistor according to claim 1 characterised in that the gate electrode is applied directly to the surface of the substrate to provide a MESFET configuration.

4. A field effect transistor according to claim 1 characterised in that the non-diamond p+ material is p+ doped amorphous semiconductor material and the source and drain contacts are quasi-ohmic contacts formed by the deposition of the p+ doped amorphous semiconductor material on the substrate with a metal layer being deposited on the p+ doped semiconductor material, portions of the metal layer and the layer of p+ amorphous semiconductor material being removed selectively to define the spaced apart source and drain regions, with a gate region being defined between the source and drain regions.

5. A field effect transistor according to claim 4 wherein said metal layer is a metal selected from the group consisting of aluminum, molybdenum, molybdenum/tantalum alloy, chrome, titanium, nichrome, titanium/tungsten alloy, palladium, platinum and an aluminum/silicon alloy.

6. A field effect transistor according to claim 4 wherein said semiconductor material is silicon.

7. A field effect transistor according to claim 4 wherein said semiconductor material is germanium.

* * * * *

UNITED STATES PATENT AND TRADEMARK OFFICE
CERTIFICATE OF CORRECTION

PATENT NO.   :   5,072,264
DATED        :   December 10, 1991
INVENTOR(S)  :   Barbara Lynn Jones It is certified that error appears in the above-indentified patent and that said Letters Patent is hereby corrected as shown below:

Column 2, line 68:   after "and" insert --drain regions of the transistor.  It can thus be seen--

Signed and Sealed this

Second Day of August, 1994

Attest:

BRUCE LEHMAN

*Attesting Officer*       *Commissioner of Patents and Trademarks*